United States Patent
Beers et al.

(10) Patent No.: US 7,027,323 B2
(45) Date of Patent: Apr. 11, 2006

(54) STORAGE DEVICE HAVING PARALLEL CONNECTED MEMORY CELLS THAT INCLUDE MAGNETORESISTIVE ELEMENTS

(75) Inventors: John R. Beers, Boise, ID (US); Corbin L. Champion, Pullman, WA (US); Kenneth K. Smith, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 39 days.

(21) Appl. No.: 10/817,462

(22) Filed: Apr. 2, 2004

(65) Prior Publication Data

US 2005/0226071 A1     Oct. 13, 2005

(51) Int. Cl.
*G11C 11/00* (2006.01)
(52) U.S. Cl. .................... 365/158; 365/171; 365/173
(58) Field of Classification Search ................ 365/158, 365/171, 173
See application file for complete search history.

(56) References Cited

U.S. PATENT DOCUMENTS

| | | | |
|---|---|---|---|
| 6,185,143 | B1 | 2/2001 | Perner et al. |
| 6,804,144 | B1 * | 10/2004 | Iwata .................... 365/158 |
| 2002/0047145 | A1 | 4/2002 | Nickel |
| 2003/0161179 | A1 | 8/2003 | Bloomquist et al. |
| 2003/0188240 | A1 | 10/2003 | Perner |
| 2003/0206432 | A1 | 11/2003 | Munden et al. |

OTHER PUBLICATIONS

U.S. Appl. No. 10/614,581, entitled "Memory Cell Strings in a Resistive Cross Point Memory Cell Array," by Kenneth K. Smith et al., filed Jul. 7, 2003.

* cited by examiner

*Primary Examiner*—Huan Hoang

(57) ABSTRACT

A storage device includes plural groups of memory cells, wherein the memory cells comprise magnetoresistive elements. Each group includes a transistor, and the memory cells of each group include a first set of parallel connected memory cells that are connected to a node of the transistor. The storage device further includes a sensing device to detect a state of a memory cell in a selected one of the groups.

26 Claims, 7 Drawing Sheets

STORAGE DEVICE HAVING PARALLEL CONNECTED MEMORY CELLS THAT INCLUDE MAGNETORESISTIVE ELEMENTS

BACKGROUND

In computing systems, such as desktop computers, portable computers, personal digital assistants (PDAs), servers, and others, storage devices are used to store data and program instructions. One type of storage device is a disk-based device, such as a magnetic disk drive (e.g., a floppy disk drive or hard disk drive) and an optical disk drive (e.g., a CD or DVD drive). Disk-based storage devices have a rotating storage medium with a relatively large storage capacity. However, disk-based storage devices offer relatively slow read-write speeds when compared to operating speeds of other components of a computing system, such as microprocessors and other semiconductor devices.

Another type of storage device is a solid state storage device, such as a dynamic random access memory (DRAM) device, static random access memory (SRAM) device, flash memory device, and electrically erasable and programmable read-only memory (EEPROM) device. Another variant of a solid state storage device is a magnetoresistive solid state storage device, such as a magnetoresistive random access memory (MRAM) device. A typical MRAM device includes an array of memory cells (each memory cell made up of a magnetoresistive element) that are selected by word lines extending along rows of the memory cells, and bit lines extending along columns of the memory cells. In one conventional implementation, each memory cell is located at a cross point of a word line and a bit line.

Examples of magnetic memory cells include tunneling magnetoresistance (TMR) memory cells, giant magnetoresistance (GMR) memory cells, or colossal magnetoresistance (CMR) memory cells. These types of memory cells are commonly referred to as spin valve memory (SVM) cells.

An SVM cell includes two magnetic layers that are separated by a dielectric layer. The orientation of magnetization of one of the magnetic layers can be altered, while the orientation of magnetization of the other magnetic layer is fixed or "pinned" in a particular orientation. The magnetic layer having alterable magnetization is typically referred to as a "data storage layer" or "sense magnetic layer," while the magnetic layer that is pinned is typically referred to as a "reference layer" or a "pinned magnetic layer." The dielectric layer is an insulating tunnel barrier sandwiched between the magnetic layers.

The SVM cell exhibits tunneling magnetoresistance (TMR), giant magnetoresistance (GMR), or colossal magnetoresistance (CMR), in the presence of the magnetic field provided by the magnetic layers. Relative orientation and magnitude of spin polarization of the magnetic layers determine the resistance of the SVM cell. Generally, resistance of the SVM cell is a first value R if the magnetic layers have a parallel magnetization orientation, and the resistance is increased to a second value $R+\Delta R$ if the magnetization orientation is changed from parallel to anti-parallel.

The two magnetization orientations, parallel and anti-parallel, of an SVM cell represent different data states, such as logical "0" and "1." The orientation may be changed from parallel to anti-parallel, or vice-versa, by applying the proper magnetic field to the SVM cell. Typically, the orientation of magnetization of a storage cell is a stable orientation that does not change until a magnetic field is applied to change the orientation of magnetization. Therefore, an MRAM device is able to provide non-volatile storage. The magnetization orientation of a selected memory cell is detected by measuring the resistance of the SVM cell associated with the selected memory cell.

The density of memory cells that can be packed into an MRAM device is dependent upon the number of active elements that have to be provided in the array of memory cells in the MRAM device. Normally, such active elements include transistors that are used to provide isolation between memory cells. The transistors are activated by control signals to connect corresponding memory cells to bit lines for performing reads of and writes to the memory cells. The presence of transistors in a memory cell array reduces the amount of space available in the MRAM device for actual memory cells.

DETAILED DESCRIPTION

Figure 1:
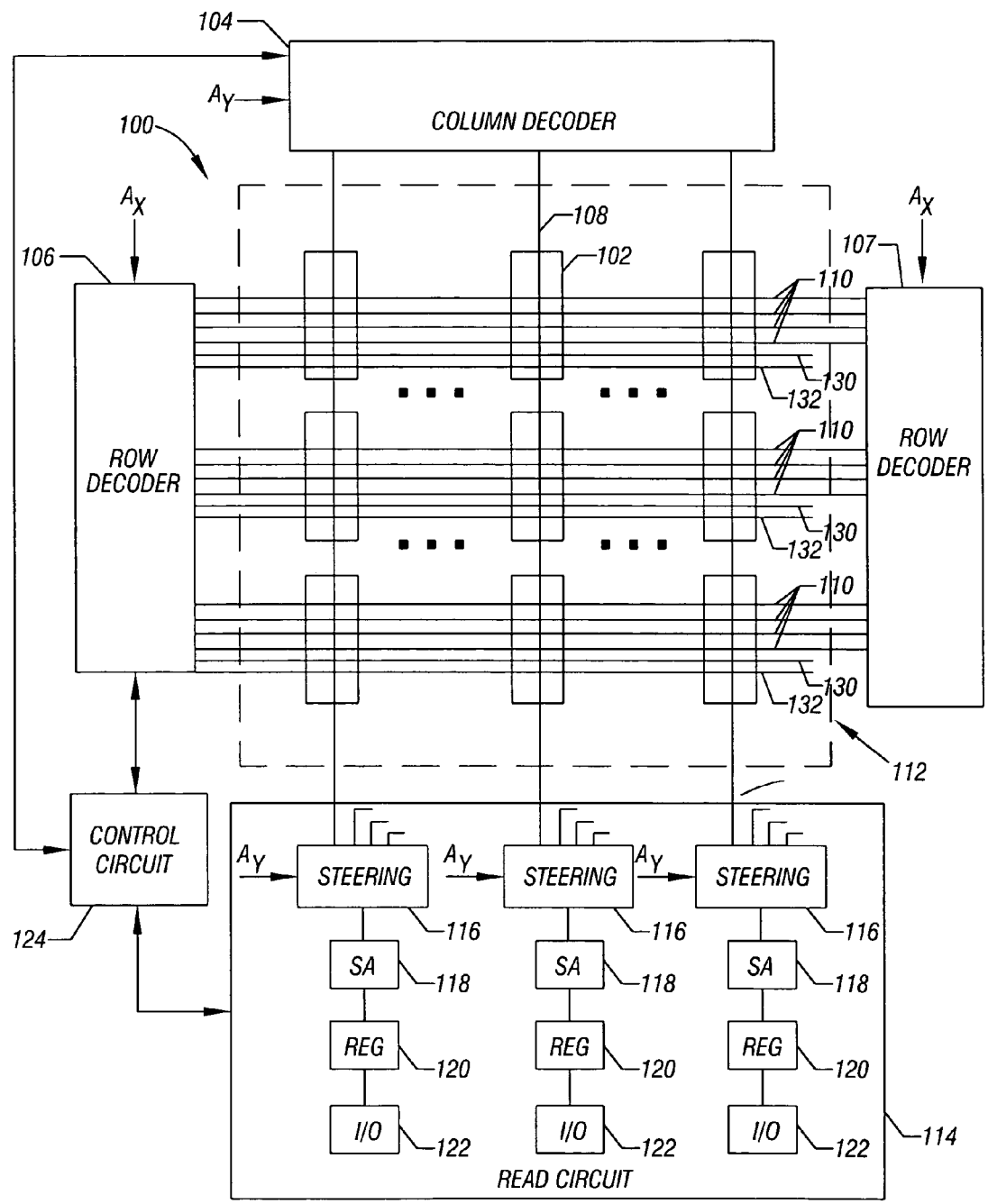
FIG. 1 is a block diagram of an embodiment of a magnetoresistive storage device.

FIG. 1 shows a magnetoresistive storage device 100, which in one example implementation is a magnetoresistive random access memory (MRAM) device that includes an array 112 of memory cell strings 102. Each memory cell string 102 includes a plurality of memory cells that are arranged in plural sets of parallel connected memory cells. For example, each memory cell string 102 includes a first set of memory cells connected in parallel, and a second set of memory cells connected in parallel. The two sets of parallel connected memory cells are also connected to a common node that provides a sense point. The sense point is used for detecting the state of a selected one of the memory cells in the memory cell string 102.

The memory cells comprise magnetoresistive elements. A magnetoresistive element includes material(s) that changes resistance in the presence of a magnetic field.

The storage device 100 includes row decoders 106 and 107 that drive write word lines 110. A write word line 110 is activated to cause a memory cell in a selected memory cell string 102 to be written to a desired state. The row decoder 106 also drives read word lines 130 and 132, which are activated during a read operation. The read word lines 130 and 132 run in a generally parallel direction as the write word lines 110.

The memory cell strings 102 are arranged in rows and columns. Each memory cell string 102 is selected by a combination of a word line (110, 130, 132) and a bit line 108 (driven by a column decoder 104). Each memory cell within a memory cell string 102 is accessed by use of a combination of write word lines 110 and read word lines 130 and 132. During a read operation, when a read word line 130 or 132 is activated, a bias voltage (Vbias1 or Vbias2 in FIG. 4) is raised from a ground potential to a predetermined potential to activate a memory cell string 102. A read voltage from an internal node of the memory cell string 102 is then passed to a bit line 108. The row decoder 106 selects a read word line 130 or 132 for activation based on row address (Ax) bits. The column decoder 104 selects bit lines 108 to connect to selected memory cells based on column address (Ay) bits. By using the write word lines 110 in this selection process, an individual memory cell in the selected memory cell string is read, which is described in further detail below.

According to one example implementation, four write word lines 110 are illustrated as traversing each memory cell string 102. In this implementation, each memory cell string 102 contains four memory cells that are selected by the respective write word lines 110. However, in other embodiments, a greater number of memory cells can be included in each memory cell string 102. More generally, if a memory cell string 102 includes N memory cells, then N write word lines 110 are used to select the respective N memory cells.

Each memory cell string 102 includes an active device, such as a transistor, that is shared by the multiple memory cells of the memory cell string 102. Such sharing by memory cells of a transistor in each memory cell string 102 reduces the number of transistors that have to be provided in the array 112. As a result, a greater density of memory cells can be provided in the array 112 (as compared to an arrangement in which each memory cell is allocated an individual transistor). The transistor in each memory cell string 102 is effectively a source follower amplifier that provides isolation such that only memory cells of one of the memory cell strings 102 along a given bit line 108 are electrically coupled to the bit line 108. Because the bias voltage for unselected memory cells is held at the ground potential, there is no current through transistors of unselected memory cell strings. Therefore, only one memory cell string 102 is coupled to the bit line 108 at a time. In other words, during a read operation or write operation, one of the memory cell strings 102 along a given bit line 108 is selected to electrically connect to the bit line 108, while the other memory cell strings 102 along the same bit line 108 are electrically isolated from the bit line 108.

During a write operation, the row decoder 106 or 107 applies a write current to a selected write word line 110, and the column decoder 104 causes a write current to be applied to selected one or more bit lines 108. Application of current to the write word line 110 and bit line(s) 108 causes memory cell(s) to be written to desired state(s).

During a read operation, the row decoder 106 applies a write current to a selected write word line 110 and the column decoder 106 causes a write current to be applied to selected bit line(s) 108 for a short period of time to also cause writing of memory cell(s). In another implementation, instead of a shared bit line 108 for read and write operations, a dedicated write column line (run parallel to bit line 108) is provided that is electrically isolated from the cell. The difference between a write operation and a read operation, however, is that during the read operation, a selected memory cell is written to a known state for purposes of detecting whether or not the state of the memory cell changes. There is a dual purpose for bit line 108. When writing, the bit line 108 is used to provide current to rotate the magnetization orientation of a memory cell. During the sense portion of a read, the bit line 108 is used to transfer a voltage to a sense amplifier (SA) 118. Detection of a change in the state of the selected memory cell indicates that the memory cell stores a data bit having a first state. However, if the state of the selected memory cell does not change in response to the writing of the memory cell to the known state, then that indicates that the memory cell stores a data bit having a second state. Moreover, during a read operation, if it is detected that the selected memory cell has changed state as a result of the write to the known state, the memory cell is changed back to its previous state by performing another write.

During a read operation, the state of a selected memory cell is determined by a read circuit 114, which includes sense amplifiers (SA) 118 for detecting voltage levels of respective bit lines 108. In response to a memory cell being connected to a bit line 108, the bit line 108 is driven to a voltage level corresponding to the state of the selected memory cell.

The read circuit 114 also includes steering circuits 116 that are connected to respective sense amplifiers 118. Multiple bit lines 108 are connected to each steering circuit 116. Each steering circuit 116 selects one of the multiple bit lines 108 to connect to a respective sense amplifier 118 based on certain column address (Ay) bits. Each steering circuit 116 also connects write current to a respective bit line 108 under control of the column decoder 104.

The read circuit 114 further includes registers 120 and input/output (I/O) circuitry 122. The registers 120 are used for temporarily storing data that has been read from the memory cells of the array 112. The I/O circuitry 122 outputs data to output pads of the MRAM device 100.

The MRAM device 100 also includes a control circuit 124 that provides control signals such as timing signals to the row decoder 106, column decoder 104, and the read circuit 114. The control circuit 124 controls the sequencing of tasks to be performed during write and reads operation.

Figure 2:
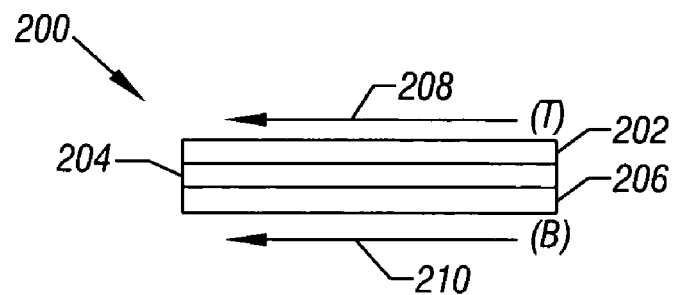
FIG. 2 illustrates a parallel magnetization orientation of a memory cell in the magnetoresistive storage device of FIG. 1.
Figure 3:
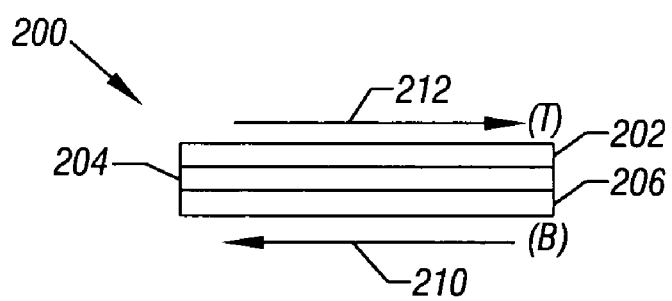
FIG. 3 illustrates an anti-parallel magnetization orientation of a memory cell in the magnetoresistive storage device of FIG. 1.

FIGS. 2 and 3 illustrate the parallel and anti-parallel magnetization orientations of a memory cell 200. Note that multiple memory cells 200 are provided in each memory cell string 102 (FIG. 1). The memory cell 200 includes first and second magnetic layers 202 and 206, and a dielectric layer 204 sandwiched between the magnetic layers 202 and 206. According to some embodiments, each of the magnetic layers 202 and 206 is formed of one of the following materials: nickel iron (NiFe), nickel iron cobalt (NiFeCo), cobalt iron (CoFe), alloys of such metals, or any other ferromagnetic or ferrimagnetic material. The dielectric layer 204 can be made of aluminum oxide ($Al_2O_3$), silicon dioxide ($SiO_2$), tantalum oxide ($Ta_2O_5$), silicon nitride ($SiN_4$), or any other insulating material that exhibits electron tunneling characteristics in the presence of a magnetic field.

According to one implementation, the magnetic layer 202 is a sense layer, and the magnetic layer 206 is a pinned layer. The pinned layer has a magnetization that is oriented in a plane (indicated by arrow 210). The pinned nature of the pinned layer is typically established with the use of anti-ferromagnetic (AFM) material in direct physical contact with a ferromagnetic (FM) material. AFM materials magnetically order below their Neel temperatures ($T_N$), the temperature at which they become anti-ferromagnetic or anti-ferrimagnetic. The Neel temperature of AFM materials is analogous to the Curie temperature ($T_C$) of FM materials, the temperature above which a FM loses its ability to possess an ordered magnetic state in the absence of an external magnetic field. Generally $T_C$ of the FM is greater than $T_N$ of the AFM. The magnetization of the pinned layer is fixed in the indicated direction so as not to rotate in the presence of an applied magnetic field within a predetermined range. The sense layer, on the other hand, has a magnetization that can be oriented in either of two directions in response to an applied magnetic field.

In FIG. 2, the magnetization of the sense layer is oriented in a direction indicated by the arrow 208. Thus, in the FIG. 2 arrangement, the sense layer and the pinned layer have a parallel magnetization orientation. However, as shown in FIG. 3, the sense layer has a magnetization that is oriented in an opposite direction, indicated by the arrow 212. In the FIG. 3 arrangement, the pinned and sense layers have an anti-parallel magnetization orientation. It is to be understood that the figures are schematic representations, and are not intended to represent drawings to scale.

The dielectric layer 204 provides an insulation tunneling barrier that allows quantum mechanical tunneling to occur between the magnetic layers 202 and 206. This tunneling phenomenon is electron spin dependent, making the resistance of a spin valve memory (SVM) cell (formed by the magnetic layers 202 and 206 and the dielectric layer 204) a function of the magnetization orientation of the sense and pinned layers. For instance, if the magnetization orientation of the pinned and sense layers is parallel, then the SVM cell has a first resistance R. The resistance of the SVM cell is increased to $R+\Delta R$ if the magnetization orientation is changed from parallel to anti-parallel. The parallel magnetization orientation depicted in FIG. 2 corresponds to a first logical state (e.g., logical "0"), and the anti-parallel magnetization orientation of FIG. 3 corresponds to a second storage state (e.g., logical "1"). In a different implementation, the parallel magnetization orientation can correspond to logical "1" while the anti-parallel magnetization orientation can correspond to logical "0."

Figure 7:
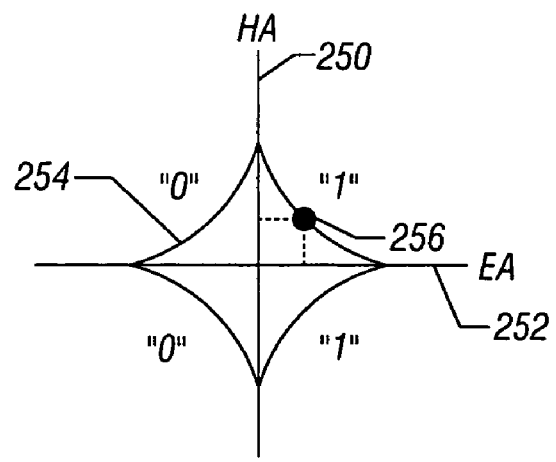
FIG. 7 illustrates combining fields along a hard axis HA and an easy axis EA to provide a "Stoner-Wohlfarth" asteroid switching model.

According to one implementation, writing a memory cell is explained in connection with FIG. 7. As illustrated in FIG. 7, combining fields along the hard axis HA 250 and easy axis EA 252 provides a "Stoner-Wohlfarth" asteroid switching model. The combined fields provide a switching field represented as asteroid 254. An individual field or combined field that falls within the asteroid 254 is insufficient to overcome the coercivity of a particle, whereas an individual or combined set of fields falling on or outside the asteroid 254 will overcome the coercivity of the particle. More specifically, point 256 represents a combined field sufficient to overcome the coercivity of a particle and align it to a parallel magnetization orientation, at a point where the individual fields would be insufficient on their own.

Although reference is made to memory cells that are SVM cells in the described embodiments, other types of magnetoresistive elements can be used in other implementations of memory cells.

As further shown in FIGS. 2 and 3, the stack of layers making up the memory cell 200 has a top (T) end and a bottom (B) end. To sense the resistance of the memory cell 200, an electrical current is provided through the layers 202, 204, and 206 of the stack making up the memory cell 200. In some cases, there may be slight variations of resistance depending upon whether current flows from the top (T) to bottom (B) or bottom (B) to top (T). To avoid inconsistencies in detected resistances, the multiple memory cells 200 in each memory cell string 102 (FIG. 1) are arranged such that current flows in a consistent direction through the memory cells of the memory cell string 102 regardless of which of the memory cells is selected for reading. The sets of parallel connected memory cells (102, shown in FIG. 4), along with the use of two read word lines 130 and 132 per memory cell string 102, enables such consistent direction of current flow through the memory cells to enable more consistent resistance measurements. The tunneling magnetoresistance (TMR), giant magnetoresistance (GMR), or colossal magnetoresistance (CMR), of a magnetoresistive element making up a memory cell 200 may be different based on the direction of current flow (T to B or B to T) through the magnetoresistive element.

Figure 4:
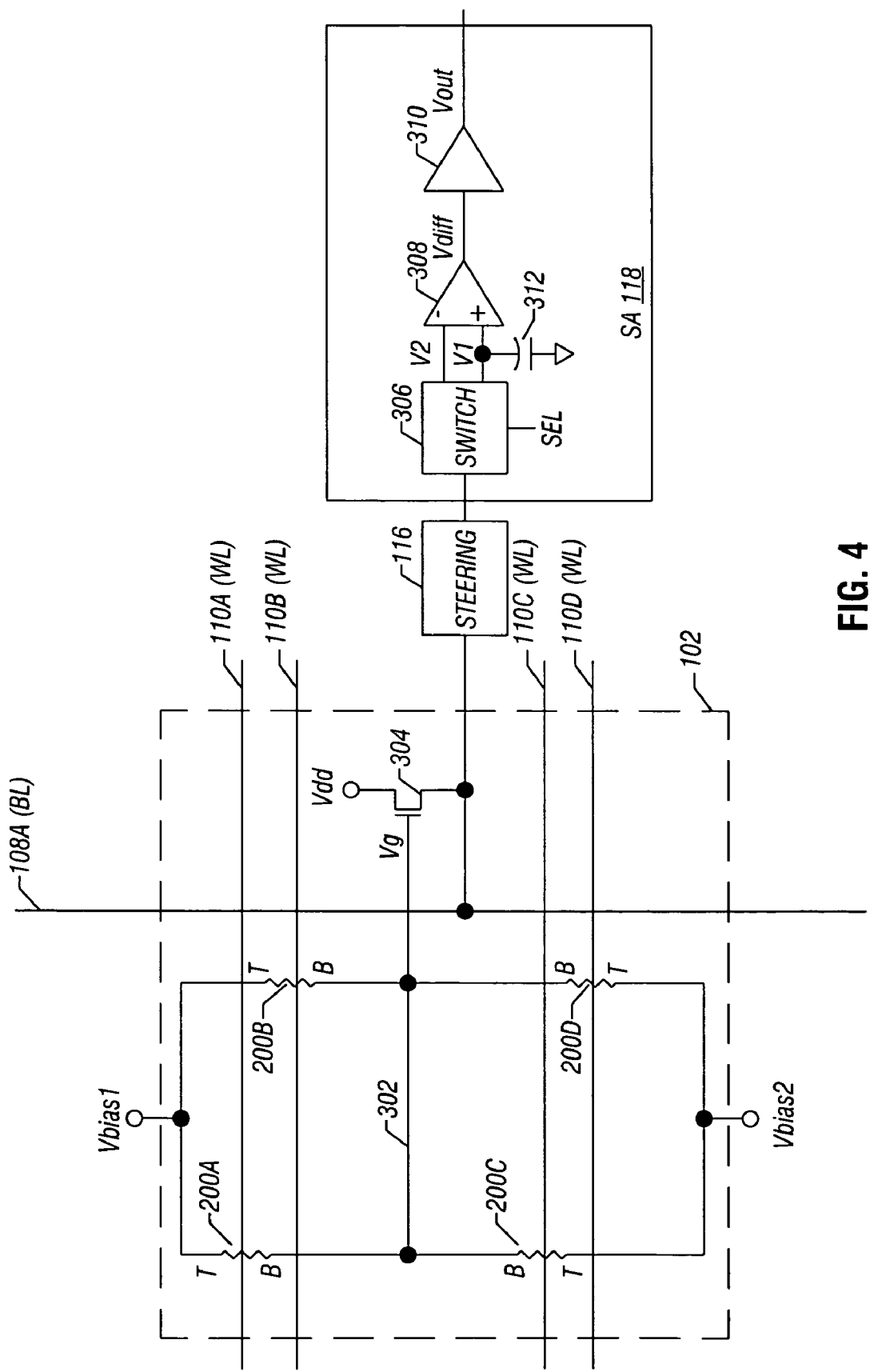
FIG. 4 is a schematic diagram of a string of parallel arranged memory cells that are coupled to a sense amplifier, in accordance with an embodiment of the invention.

FIG. 4 shows the arrangement of memory cells 200 (200A, 200B, 200C, 200D shown) within a memory cell string 102 that is connected to a particular bit line 108A. Note that the depicted bit line 108A is also connected to other memory cell strings 102. Each memory cell 200 is represented as a resistor (corresponding to the magnetoresistance of the memory cell) in FIG. 4.

The memory cell string 102 includes a first set of parallel connected memory cells 200A, 200B, and a second set of parallel connected memory cells 200C, 200D. The memory cell 200A is connected between a first bias voltage signal Vbias1 and a common node 302. The memory cell 200B is also connected between Vbias1 and the common node 302. The memory cells 200A and 200B are thus connected in parallel between Vbias1 and the common node 302. Similarly, the memory cells 200C and 200D are connected in parallel between a second bias voltage signal Vbias2 and the common node 302. The memory cells 200A, 200B, 200C, and 200D effectively form a voltage divider between Vbias1 and Vbias2. The voltage level at the sense point (node 302) is dependent upon the resistances of the memory cells 200A, 200B, 200C, and 200D. Note that the resistance of each memory cell is either a parallel orientation resistance or an anti-parallel orientation resistance.

Figure 9:
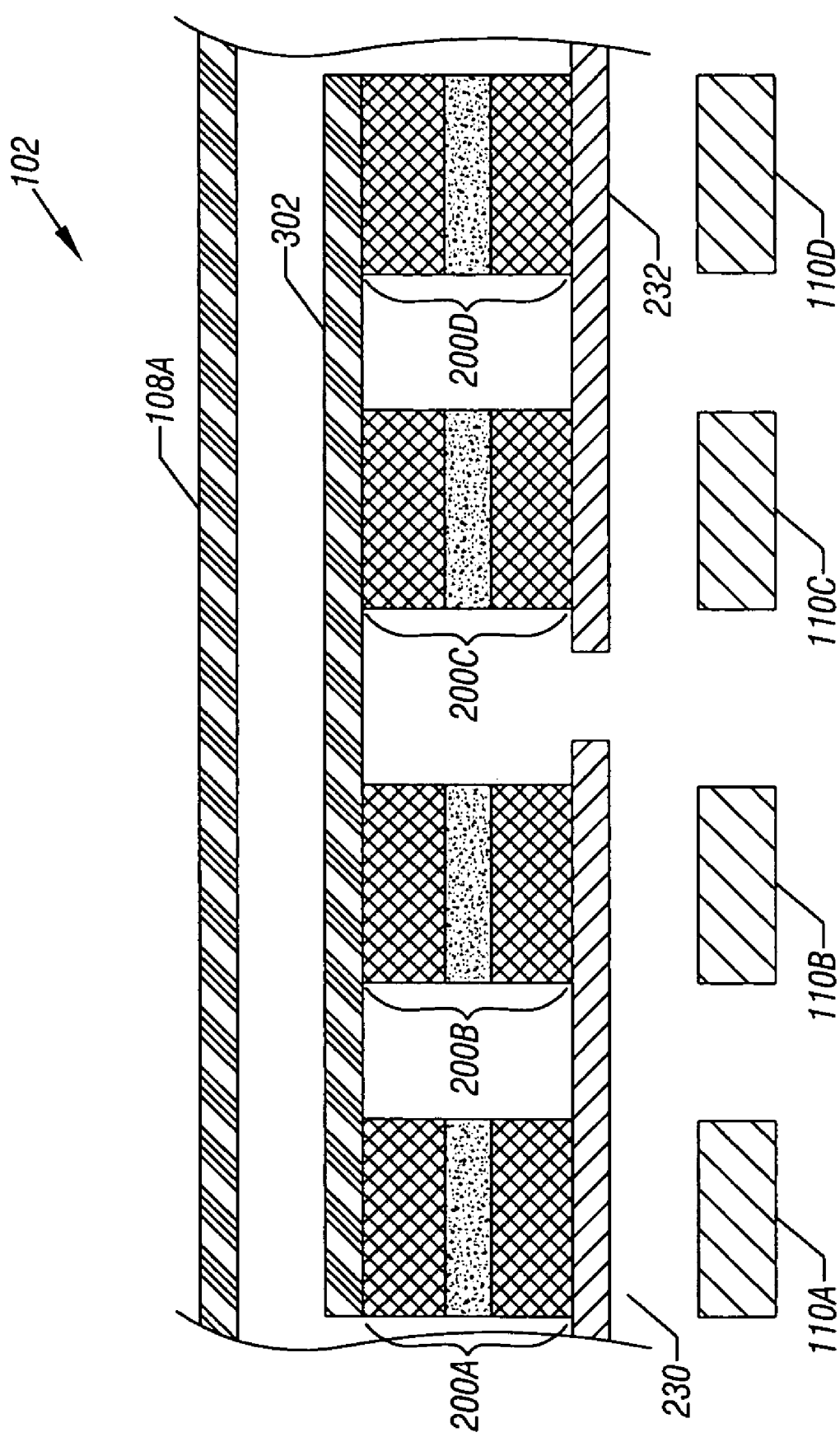
FIG. 9 is a cross-sectional view of the memory cell string of FIG. 4, in accordance with an embodiment.

FIG. 9 depicts a cross-sectional view of a memory cell string 102, according to one embodiment. In the illustrated embodiment, the memory cells 200A and 200B (each made up of two magnetic layers that sandwich a dielectric layer) are provided on an electrically conductive layer 230 that is driven by Vbias1. The layer 230 is either electrically connected to or part of the read word line 130. Similarly, the memory cells 200C and 200D (each made up of two magnetic layers sandwiching a dielectric layer) are provided on an electrically conductive layer 232 that is driven by Vbias2. The layer 232 is either electrically connected to or part of the read word line 132.

An electrically conductive layer making up at least part of common node 302 is provided over the memory cells 200A–200D. A lower surface of the common node 302 is contacted to the upper surfaces of respective memory cells 200A–200D. The bit line 108A is provided above the common node 302 layer. An insulating layer separates the bit line 108A from the common node 302 layer.

The write word lines 110A and 110B are provided below the layer 230, and the write word lines 110C and 110D are provided below the layer 232. An insulating layer separates the layer 230 or 232 from each write word line 110. Each write word line 110(A, B, C, or D) is generally aligned with a respective memory cell 200(A, B, C, or D) along a vertical axis of the memory cell.

As further shown in FIG. 4, the sense point provided by the common node 302 is connected to the gate of a transistor 304 in the memory cell string 102. The common node 302 supplies a gate voltage signal Vg to the transistor 304. The source of the transistor 304 is connected to the bit line 108A, while the drain of the transistor 304 is connected to a voltage Vdd (which is a power supply voltage). In one implementation, the transistor 304 is a field effect transistor configured as a source follower amplifier. In other implementations, the transistor 304 is a bipolar transistor that may be configured as an emitter follower amplifier, wherein node 302 is connected to the base of the bipolar transistor, and the collector is connected to Vdd. Alternatively, a pass gate (such as a field effect transistor) can be connected between the common node 302 and the bit line 108A. In this configuration, the source/drain of the FET is connected to the common node, and the drain/source of the FET is connected to the bit line 108A. The gate of the FET can be connected to a select signal to turn the FET on or off. The terms "drain" and "source" are used interchangeably.

In other embodiments, more than four memory cells 200 can be provided in each string 102. For example, in a different embodiment, M memory cells, where M is greater than or equal to 3, is connected in parallel between Vbias1 and the common node 302, while M memory cells are connected in parallel between Vbias2 and the common node 302. Instead of using the term "string" to refer to the collection of memory cells 200 and the transistor 304, as depicted in FIG. 4, the term "group" can alternatively be used to refer to the collection of memory cells and an associated transistor.

Each of the other memory cell strings 102 (not shown in FIG. 4) connected to the bit line 108A also includes a respective transistor 304. When the gate of transistor 304 is at ground, the transistor 304 electrically isolates the respective memory cell string 102 from the bit line 108A. Thus, during a write or read operation, the transistor 304 of one of the memory cell strings 102 connected to the bit line 108A is activated, while the transistors 304 of the remaining memory cell strings 102 connected to the bit line 108A remain deactivated. Selection of one of the memory cell strings 102 connected to the bit line 108A is accomplished by setting Vbias1 or Vbias2 of the selected memory cell string 102 to the bias voltage, while Vbias1 and Vbias2 of each of the unselected memory cell strings 102 are both left at the ground potential.

Write word lines 110A, 110B, 110C, and 110D are used to select respective memory cells 200A, 200B, 200C, and 200D. Each of the bias voltage signals Vbias1 and Vbias2 is selectively set to a bias voltage or a ground potential as determined by row decoder 106. If the memory cell 200A or 200B is selected for writing or reading, Vbias1 is set to the bias voltage, while Vbias2 is set to the ground potential. On the other hand, if the memory cell 200C or 200D is selected, then Vbias2 is set to the bias voltage while Vbias1 is set to the ground potential.

As shown in FIG. 4, the parallel arrangement of the first set of memory cells and the second set of memory cells enables current to flow in a consistent direction through the memory cells regardless of whether the selected memory cell is above or below the common node 302. If memory cell 200A or 200B is selected, Vbias1 is set to the bias voltage and Vbias2 is set to the ground potential, which causes current to flow from T to B in the memory cells 200A and 200B on one side (the side associated with the selected memory cell) of the common node 302. On the other side of the common node 302, current flows in the B to T direction through the memory cells 200C and 200D. Similarly, if memory cell 200C or 200D is selected, Vbias2 is set to the bias voltage and Vbias1 is set to the ground potential, which causes current to flow from T to B in the memory cells 200C and 200D on one side (the side associated with the selected memory cell) of the common node 302. Current flows from B to T in the memory cells 200A and 200B on the other side of the common node 302.

According to one implementation, the bias voltage is set equal to the sense voltage of each memory cell multiplied by the number of memory cells between Vbias1 and Vbias2. If the sense voltage of a memory cell (Vg in FIG. 4) is about 0.5 volts (V), then the bias voltage can be set to 1.0V. In other implementations, the sense voltage and bias voltage can have other voltage levels.

By setting Vbias1 or Vbias2 of the selected memory cell string 102 to the bias voltage, a voltage is generated on the common node 302. This voltage is provided as Vg to the gate of the transistor 304, which turns on to drive the bit line 108A to a voltage determined by the voltage level of Vg. A steering circuit 116 is coupled to the source of the transistor 304 and the bit line 108A. The steering circuit 116 provides the voltage on the bit line 108 to a respective sense amplifier 118.

The sense amplifier 118 includes a switch 306, a capacitor 312, a differential amplifier 308, and a signal amplifier 310. The switch 306 is configured to selectively couple the bit line 108A to one of the inputs of the differential amplifier 308 (a−input and a+input) in response to a control signal SEL. If SEL is at one state, then the bit line 108A is selectively coupled to the +input of the differential amplifier 308 (which is connected to signal V1). However, if SEL is at a second state, then the switch 306 selectively couples the bit line 108A to the −input of the differential amplifier 308 (which is connected to signal V2). The capacitor 312 is connected to signal V1 to temporarily store a voltage that appears on V1.

Figure 8A:
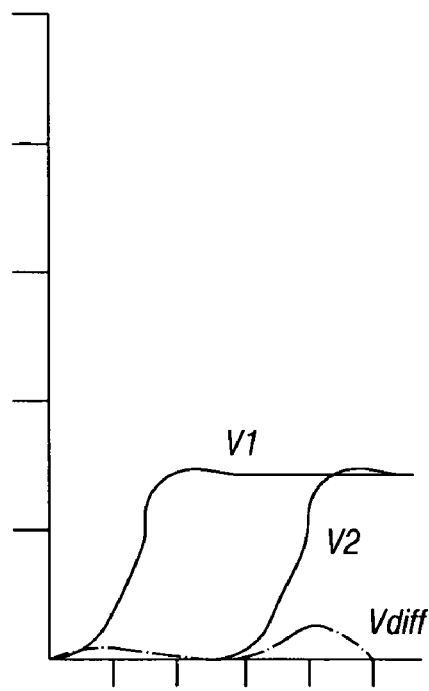
FIGS. 8A–8B are timing diagrams to illustrate operation of a differential amplifier in the sense amplifier of FIG. 4.
Figure 8B:
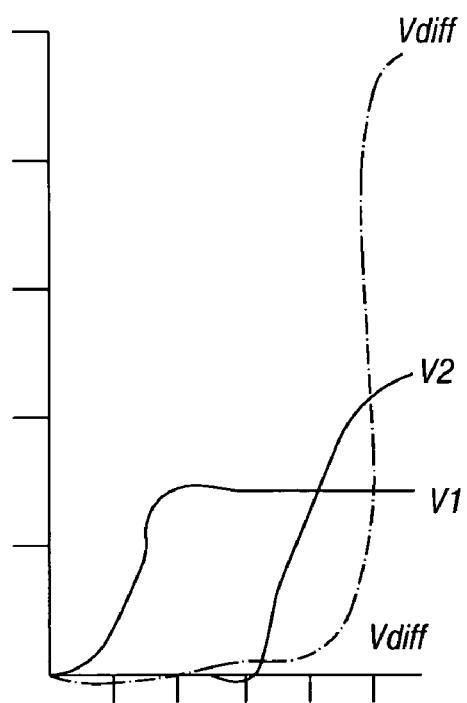

The differential amplifier 308 compares V1 with V2 and outputs a differential signal Vdiff to indicate the result of the comparison. FIG. 8A illustrates a state where V1 is substantially the same as V2, while FIG. 8B illustrates a state where V1 is different from V2. The signal Vdiff is provided to the signal amplifier 310, which outputs a signal Vout. The signal Vout has one of two possible levels to represent a logical "0" or a logical "1," which depends on whether the selected memory cell has a parallel or anti-parallel magnetization orientation.

If all four of the memory cells 200A, 200B, 200C, and 200D have the parallel magnetization orientation, then each of the four memory cells has a resistance Rp. The gate voltage Vg provided by the common node has the following voltage level if all four memory cells 200A, 200B, 200C, and 200D have the parallel magnetization orientation:

$$Vg = \frac{Rp \| Rp}{Rp \| Rp + Rp \| Rp} * Vbias = 0.5 * Vbias, \quad \text{(Eq. 1)}$$

where Vbias is the voltage difference between Vbias1 and Vbias2, and the symbol "∥" represents calculation of an effective parallel resistance based on two resistance values (Rp and Rp in Equation 1). If a selected one of the memory cells is written to the anti-parallel magnetization orientation, then the selected memory cell has a resistance Rap. In this case, the voltage Vg has a voltage calculated as:

$$Vg = \frac{Rp\|Rap}{Rp\|Rp + Rp\|Rap} * Vbias. \quad \text{(Eq. 2)}$$

The value of Vg calculated by either Equation 1 or 2 is the same whether the selected memory cell is above or below the common node 302. The same value for Vg is achieved by flowing current in a consistent direction through the memory cells regardless of whether the selected memory cell is above or below the common node 302.

The difference between Equations 1 and 2 is represented by the following:

$$\left(0.5 - \frac{Rp\|Rap}{Rp\|Rp + Rp\|Rap}\right) * Vbias. \quad \text{(Eq. 3)}$$

Assuming that there is a very small loss through the source follower amplifier, the voltage Vdiff is approximately the voltage produced by Equation 3.

Figure 5:
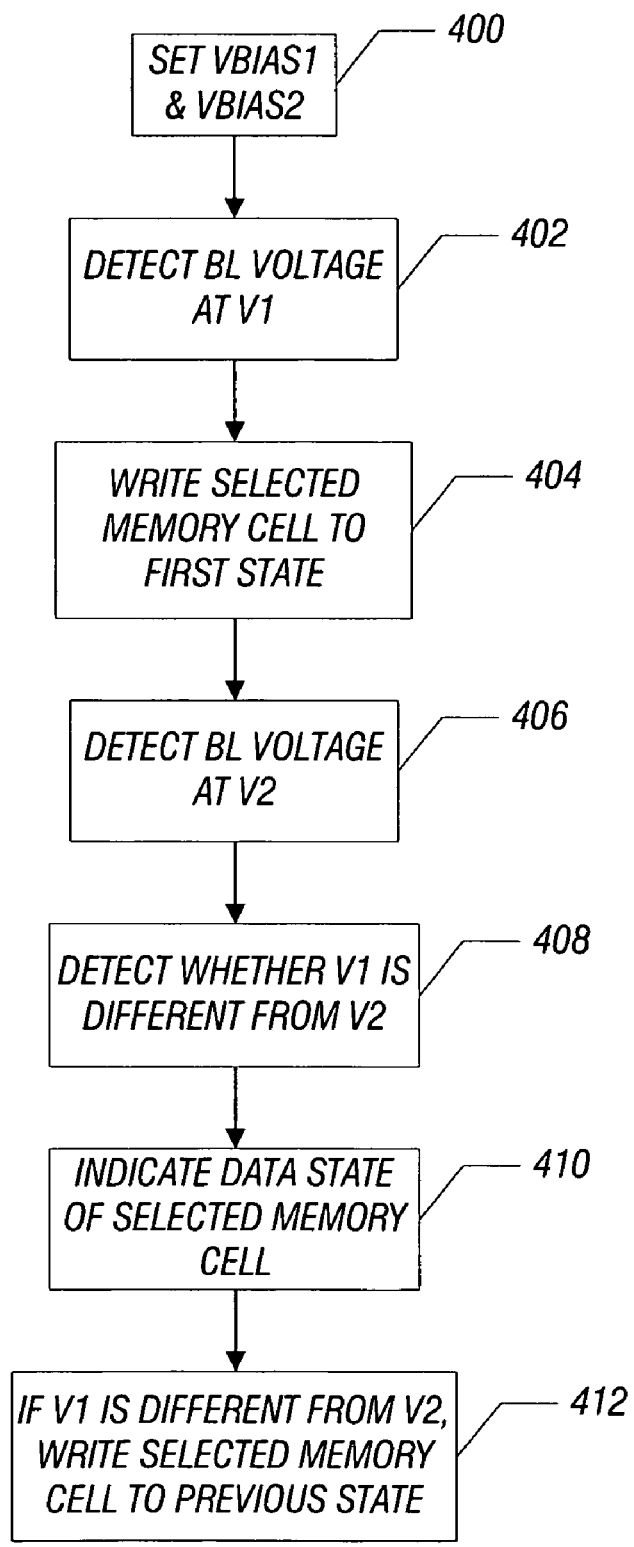
FIG. 5 is a flow diagram of reading a state of a selected memory cell in the string of FIG. 4, according to an embodiment.

Reference is made to FIGS. 4 and 5 in the following discussion. FIG. 5 is a flow diagram of a process of reading from the memory cell string 102 depicted in FIG. 4. For purposes of this discussion, it is assumed that the memory cell 200A is selected. The control circuit 124 (FIG. 1) causes (at 400) Vbias1 to be set to the bias voltage, and Vbias2 to be set to the ground potential. Note that if the memory cell 200C or 200D is selected for reading, then Vbias2 is set to the bias voltage while Vbias1 is set to the ground potential.

In response to application of the voltage difference across Vbias1 and Vbias2, voltage Vg is driven to an elevated voltage, which causes the transistor 304 to turn on. This in turn causes the bit line 108A to be driven to some voltage, which voltage is coupled by the steering circuit 116 to the sense amplifier 118. As a result, a voltage corresponding to the bit line voltage is detected (at 402) at signal V1 (+input of the differential amplifier 308). The voltage of signal V1 is sampled and held by the capacitor 312.

Subsequently, the memory cell 200A is written to a predetermined state (at 404). The predetermined state can be either the parallel state or anti-parallel state. After the write operation is complete, a sense operation is initiated, and the sense amplifier 118 detects (at 406) the voltage level of the bit line 108A at signal V2 (−input of the differential amplifier 308). The differential amplifier 308 then detects (at 408) whether V1 is different from V2 by greater than a predetermined amount. If V1 does not differ from V2 by greater than a predetermined amount, then the selected memory cell 200A stores a data bit having the predetermined state, and the signal amplifier 310 outputs (at 410) the corresponding level on Vout. However, if V1 differs from V2, then the selected memory cell 200A stores a data bit having a second state different form the predetermined state. In response, the signal amplifier 310 outputs (at 410) a voltage level on Vout corresponding to the second state. If V1 is different from V2, then the control circuit 124 (FIG. 1) causes the selected memory cell 200A to be written back (at 412) to its previous state (which is the state of the memory cell 200A before the start of the read operation discussed here).

Figure 6:
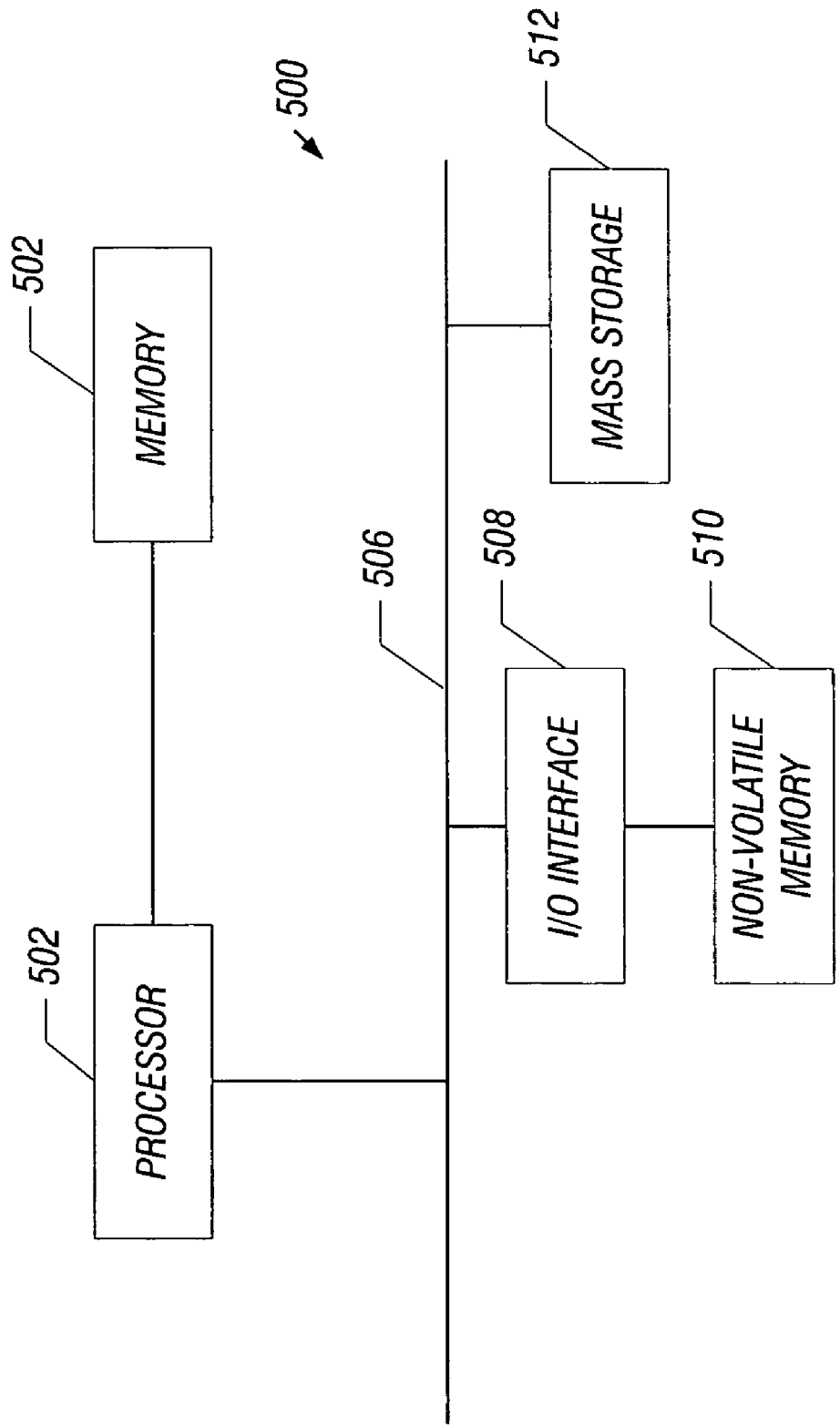
FIG. 6 is a block diagram of a system including a storage device according to an embodiment.

FIG. 6 shows a system 500 in which a storage device according to some embodiments of the invention can be incorporated. For example, a memory 502 of the system 500 can be a magnetoresistive storage device according to an embodiment. Similarly, a non-volatile memory 510 can also be a magnetoresistive storage device according to an embodiment. The memory 502 is connected to a processor 502, which is in turn connected to a bus 506. The system 500 also includes input/output (I/O) interface 508 connected to the bus 506. A mass storage device 512 is also connected to the bus. The arrangement of the system 500 of FIG. 6 is provided as an example only, as other embodiments can employ other system arrangements.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A storage device comprising:
   plural groups of memory cells, wherein the memory cells comprise magnetoresistive elements,
   wherein each group further includes a corresponding transistor, and the memory cells of each group includes a first set of memory cells coupled in parallel between a first bias signal and a common node, and a second set of memory cells coupled in parallel between a second bias signal and the common node; and
   a sensing device to detect a state of a memory cell in a selected one of the groups,
   wherein the common node is connected to a gate of the transistor, and wherein a source of the transistor is coupled to the sensing device.

2. The storage device of claim 1, wherein a drain of the transistor is coupled to a supply voltage.

3. The storage device of claim 1, further comprising a bit line connected to the groups of memory cells, the sensing device coupled to the bit line.

4. The storage device of claim 3, wherein the transistor of one of the groups of memory cells connected to the bit line is activated while the transistors of the remaining groups of memory cells connected to the bit line are deactivated.

5. The storage device of claim 3, further comprising a second bit line coupled to further groups of memory cells, the storage device further comprising a second sensing device coupled to the second bit line.

6. The storage device of claim 1, further comprising a row decoder to provide word lines for selecting rows of groups of memory cells, and a column decoder to activate bit lines connected to the groups of memory cells.

7. The storage device of claim 1, further comprising a row decoder to provide write word lines for selecting individual memory cells within each group.

8. The storage device of claim 1, wherein each memory cell is formed of a stack of layers, the stack having a first end and a second end, and wherein the memory cells of each group are arranged such that current flows from the first end to the second end in each of the memory cells of the first set.

9. The storage device of claim 1, wherein each memory cell is formed of a stack of layers, the stack having a first end and a second end,
   wherein the first set of memory cells are connected in parallel between the first bias signal and the common node such that the first end of each memory cell in the first set is connected to the first bias signal, and the second end of each memory cell in the first set is connected to the common node, wherein the second set of memory cells are connected in parallel between the second bias signal and the common node such that the first end of each memory cell in the second set is connected to the second bias signal, and the second end of each memory cell in the second set is connected to the common node.

10. A storage device comprising:
plural groups of memory cells, wherein the memory cells comprise magnetoresistive elements,
wherein each group further includes a corresponding transistor, and the memory cells of each group includes a first set of memory cells coupled in parallel between a first bias signal and a common node, and a second set of memory cells coupled in parallel between a second bias signal and the common node;
a sensing device to detect a state of a memory cell in a selected one of the groups; and
a bit line, wherein the transistor forms a pass gate, a first source/drain node of the transistor connected to the common node, a second source/drain node of the transistor connected to the bit line, and a gate of the transistor connected to a select signal.

11. A system comprising:
a processor; and
a storage device coupled to the processor, the storage device comprising:
groups of memory cells, the memory cells comprising magnetoresistive elements,
bit lines each connected to corresponding plural groups of memory cells,
wherein each group of memory cells includes memory cells connected in parallel between a bias signal and a common node, each group further comprising a transistor coupled between the common node and a respective bit line.

12. The system of claim 11, wherein the transistor of each group drives a respective bit line to a voltage based on a state of a selected one of the memory cells in the group.

13. The system of claim 12, wherein the transistor is a bipolar junction transistor configured as an emitter follower amplifier.

14. The system of claim 12, further comprising sensing devices coupled to respective bit lines to detect a state of a corresponding selected memory cell.

15. The system of claim 14, wherein the storage device further comprises:
a control circuit to perform a read operation by sensing a group of memory cells, and subsequently writing a selected memory cell to a predetermined state; and
a read circuit to detect whether the selected memory cell changes state in response to the write to the predetermined state, the read circuit to output an indicator of a state of the selected memory cell based on whether the state of the memory cell has changed.

16. The system of claim 11, wherein each group further comprises a second set of memory cells connected in parallel, wherein both of the first set of memory cells and the second set of memory cells are connected to the common node.

17. A system comprising:
a processor; and
a storage device coupled to the processor, the storage device comprising:
groups of memory cells, the memory cells comprising magnetoresistive elements,
bit lines each connected to corresponding plural groups of memory cells,
wherein each group of memory cells includes memory cells connected in parallel and coupled to a respective bit line,
wherein each group further includes a transistor connected to the memory cells of the group, the transistor to drive a respective bit line to a voltage based on a state of a selected one of the memory cells in the group,
wherein the transistor is a field effect transistor configured as a source follower amplifier.

18. A system comprising:
a processor; and
a storage device coupled to the processor, the storage device comprising:
groups of memory cells, the memory cells comprising magnetoresistive elements,
bit lines each connected to corresponding plural groups of memory cells,
wherein each group of memory cells includes a first set of memory cells connected in parallel and coupled to a respective bit line,
wherein each group further comprises a second set of memory cells connected in parallel, wherein both of the first set of memory cells and the second set of memory cells are connected to a common node,
wherein each group comprises a transistor having a gate connected to a corresponding common node.

19. The system of claim 18, wherein each group of memory cells is coupled between a first bias voltage signal and a second bias voltage signal, wherein the group of memory cells is activated by setting one of the first and second bias voltage signals to a bias voltage, and setting the other one of the first and second bias voltage signals to a ground potential.

20. A method of reading data in a storage device, comprising:
selecting at least one of a plurality of groups of memory cells, the memory cells comprising magnetoresistive elements, wherein each group of memory cells includes a first set of memory cells connected in parallel between a first bias signal and a common node, and a second set of memory cells connected in parallel, between a second bias signal and the common node;
setting the first and second bias signals of the selected group of memory cells at different voltage potentials;
detecting a voltage at the common node of the selected group of memory cells; and
outputting an indicator of a data state in response to the detected voltage of the common node.

21. The method of claim 20, wherein detecting the voltage comprises detecting a first voltage, the method further comprising:
writing a first memory cell to a first state;
measuring a second voltage at the common node; and
determining whether the first voltage differs from the second voltage,
wherein outputting the indicator is based on a difference between the first and second voltages.

22. The method of claim 20, further comprising:
driving a bit line to a voltage in response to the voltage of the common node.

23. The method of claim 22, further comprising a sense amplifier detecting a voltage level of the bit line.

24. A method of reading data in a storage device, comprising:
selecting at least one of a plurality of groups of memory cells, the memory cells comprising magnetoresistive elements, wherein each group of memory cells includes a first set of memory cells connected in parallel and a second set of memory cells connected in parallel, the first and second sets of memory cells connected to a common node;

detecting a voltage at the common node of the selected group of memory cells;

outputting an indicator of a data state in response to the detected voltage of the common node;

driving a bit line to a voltage in response to the voltage of the common node;

a sense amplifier detecting a voltage level of the bit line;

during a read operation, the sense amplifier detecting a first voltage associated with the bit line corresponding to a state of a selected memory cell;

during the read operation, performing a write of the selected memory cell to a predetermined state; and during the read operation, the sense amplifier detecting a second voltage associated with the bit line after writing the selected memory cell to the predetermined state.

25. The method of claim 24, further comprising:
comparing the first and second voltages;

outputting an indicator of a first logical state in response to determining that the first and second voltages are substantially the same; and outputting an indicator of a second logical state in response to determining that the first and second voltages are different by greater than a predetermined amount.

26. A storage device comprising:

plural groups of memory cells, wherein the memory cells comprise magnetoresistive elements, wherein each group includes a first set of memory cells coupled in parallel between a first bias signal and a common node, and a second set of memory cells coupled in parallel between a second bias signal and the common node, wherein for a selected one of the groups, the first and second bias signals are set at different voltage potentials; and a sensing device to detect a state of a memory cell in the selected one of the groups.

* * * * *